United States Patent
Zou

(10) Patent No.: US 9,634,277 B2
(45) Date of Patent: Apr. 25, 2017

(54) STRUCTURE OF WHITE OLED DEVICE

(71) Applicant: Shenzhen China Star Optoelectronics Technology Co., Ltd., Shenzhen, Guangdong (CN)

(72) Inventor: Qinghua Zou, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 74 days.

(21) Appl. No.: 14/424,014

(22) PCT Filed: Oct. 31, 2014

(86) PCT No.: PCT/CN2014/089954
§ 371 (c)(1),
(2) Date: Feb. 25, 2015

(87) PCT Pub. No.: WO2016/061840
PCT Pub. Date: Apr. 28, 2016

(65) Prior Publication Data
US 2016/0254474 A1    Sep. 1, 2016

(30) Foreign Application Priority Data
Oct. 21, 2014 (CN) .......................... 2014 1 0563953

(51) Int. Cl.
H01L 27/32       (2006.01)
H01L 51/50       (2006.01)
(Continued)

(52) U.S. Cl.
CPC ............ *H01L 51/502* (2013.01); *B82Y 20/00* (2013.01); *H01L 27/3244* (2013.01); *H01L 51/504* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/5253* (2013.01); *H01L 51/5278* (2013.01);
(Continued)

(58) Field of Classification Search
CPC .. H01L 27/3244; H01L 51/502; H01L 51/504
USPC .................. 257/59, 72, 79, 98, 102–105
See application file for complete search history.

(56) References Cited

U.S. PATENT DOCUMENTS

2015/0228697 A1* 8/2015 Liu et al. .............. H01L 27/322
257/40

FOREIGN PATENT DOCUMENTS

| CN | 101447555 A | 6/2009 |
|---|---|---|
| CN | 103500803 A | 1/2014 |

OTHER PUBLICATIONS

Machine Translation of CN 10144755.*

* cited by examiner

Primary Examiner — Ori Nadav
Assistant Examiner — Vernon P Webb
(74) Attorney, Agent, or Firm — Andrew C. Cheng

(57) ABSTRACT

The present invention provides a structure of a white OLED device that includes a plurality of emissive layers, of which at least one emissive layer is made of a quantum dot and at least one emissive layer is made of an organic light emission material so as to combine the advantages of the quantum dot and the organic light emission material, where the manufacturing cost is low, the utilization of material is high, and the light emission efficiency is high thereby increasing the brightness of a display device and providing excellent performance for use in flat panel display devices, televisions, and other fields of display.

9 Claims, 2 Drawing Sheets

(51) Int. Cl.
*B82Y 20/00* (2011.01)
*H01L 51/52* (2006.01)
*H01L 51/56* (2006.01)
*B82Y 40/00* (2011.01)

(52) U.S. Cl.
CPC .............. *H01L 51/56* (2013.01); *B82Y 40/00* (2013.01); *H01L 2227/323* (2013.01); *Y10S 977/774* (2013.01); *Y10S 977/824* (2013.01); *Y10S 977/89* (2013.01); *Y10S 977/952* (2013.01)

STRUCTURE OF WHITE OLED DEVICE

BACKGROUND OF THE INVENTION

1. Field of the Invention

The present invention relates to the field of displaying technology, and in particular to a structure of a white OLED (Organic Light-Emitting Diode) device.

2. The Related Arts

An OLED is a flat panel displaying technique of extremely prosperous future and it shows excellent displaying performance and also possesses various advantages, such as being self-luminous, simple structure, being ultra-thin, fast response, wide view angle, low power consumption, and being capable of achieving flexible displaying and is thus regarded as a "dream display". In addition, the investment of manufacturing installation is far less than that of TFT-LCDs (Thin-Film Transistor Liquid Crystal Displays) so that it is now favored by major display manufacturers and becomes the mainstream of the third-generation display devices of the field of displaying technology. Being on the eve of mass production, new techniques of OLED emerges virtually unlimitedly with the deepening of research and development thereof and thus, OLED displays are undergoing a break-through progress.

For full-colorization of OLED devices, one solution is to overlap a white organic light-emitting diode (WOLED) with a color filter (CF). Overlapping a WOLED and a CF requires no precise masking operations and high resolution can be achieved for the OLED device.

Recently, with the progress of the semiconductor technology, various light-emitting devices have been proposed. A quantum dot light-emitting diode (QD-LED) semiconductor technique is one of them. Light of arbitrary visible light wavelength (virtually all colors) can be generated and emitted by changing the size of a quantum dot of a light emission material. It is a quantum dot organic light emission device that is formed by combining together an organic material and an inorganic nanometer crystal having a high efficiency of light emission to show a novel structure and it shows technical advantages and prosperity of future applications that cannot be matched by the traditional inorganic semiconductor light-emitting diodes.

Since the QD-LED has a large number of advantages, the quantum-dot light-emitting diode has a prosperous future in various applications. The QD-LED is an inorganic quantum dot that serves as a composite material for a light emissive layer, which besides possessing the properties of small molecules and polymer materials, can lower down the severe requirement for packaging. Since a quantum dot is composed of an inorganic material, it shows better stability in moisture and oxygen than organic semiconductor of the same kind does. The quantum LED has quantum efficiency as high as 90% and can be used with a commercialized organic transporting layer to make a QD-LED device. Since white light is favorite in commercial applications and a color quantum dot gives off light that is relatively pure, the study of white QD-LED devices are attracting more and more attention.

SUMMARY OF THE INVENTION

An object of the present invention is to provide a structure of a white OLED device, which comprises a plurality of light emissive layers of which at least one light emissive layer is made of a quantum dot and at least one light emissive layer is made of an organic light emission material so as to combine the advantages of the quantum dot and the organic light emission material, wherein the manufacturing cost is low, the utilization of material is high, and the light emission efficiency is high thereby increasing the brightness of a display device and providing excellent performance for use in flat panel display devices, televisions, and other fields of display.

To achieve the above object, the present invention provides a structure of a white organic light-emitting (OLED) device, which comprises two or more emissive layers, in which at least one of the emissive layers is made of a quantum dot and at least one of the emissive layers is made of an organic light emission material.

Preferably, the white OLED device comprises a substrate, an anode formed on the substrate, a first hole injection layer formed on the anode, a first hole transporting layer formed on the first hole injection layer, a first emissive layer formed on the first hole transporting layer, a first electron transporting layer 61 formed on the first emissive layer, a first electron injection layer formed on the first electron transporting layer, a charge generation layer formed on the first electron injection layer, a second hole injection layer formed on the charge generation layer, a second hole transporting layer formed on the second hole injection layer, a second emissive layer formed on the second hole transporting layer, a second electron transporting layer formed on the second emissive layer, a second electron injection layer formed on the second electron transporting layer, a cathode formed on the second electron injection layer, a package cover plate arranged above the cathode, and a sealing enclosure resin arranged between the substrate and the package cover plate to bond the substrate and the package cover plate together.

The first emissive layer is made of the quantum dot and the second emissive layer is made of the organic light emission material.

The quantum dot comprises one or more of a blue quantum dot, a yellow quantum dot, a green quantum dot, a red quantum dot, and a white quantum dot and light emitting from the organic light emission material of the second emissive layer is combinable with light emitting from the quantum dot of the first emissive layer to form white light.

The first electron transporting layer and the second hole transporting layer that are arranged between the first emissive layer and the second emissive layer respectively transport electrons and holes generated by the charge generation layer under an electric field to the first emissive layer and the second emissive layer to be respectively re-combined with holes and electrons injected from the anode and the cathode into the first emissive layer and the second emissive layer so as to generate light of different colors to be combined to form white light.

The charge generation layer comprises a first charge generation layer formed on the first electron injection layer and a second charge generation layer formed on the first charge generation layer. The first charge generation layer shows property of transporting electrons. The second charge generation layer shows property of transporting holes.

The charge generation layer is formed by mixing a p-type organic semiconductor and an n-type organic semiconductor.

The first emissive layer is made of the organic light emission material and the second emissive layer is made of the quantum dot.

The quantum dot comprises one or more of a blue quantum dot, a yellow quantum dot, a green quantum dot, a red quantum dot, and a white quantum dot and light emitting from the organic light emission material of the first emissive layer is combinable with light emitting from the quantum dot of the second emissive layer to form white light.

The efficacy of the present invention is that the present invention provides a structure of a white OLED device, which comprises a plurality of emissive layers, of which at least one of the emissive layers is made of a quantum dot and at least one of the emissive layers is made of an organic light emission material so as to combine the advantages of the quantum dot and the organic light emission material, wherein the manufacturing cost is low, the utilization of material is high, and the light emission efficiency is high thereby increasing the brightness of a display device and providing excellent performance for use in flat panel display devices, televisions, and other fields of display.

For better understanding of the features and technical contents of the present invention, reference is had to a detailed description of the present invention given below, together with the attached drawings. The drawings, however, are provided for illustration and description, not to impose undue limitations to the scope of the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

The present invention provides a structure of a white OLED (Organic Light-Emitting Diode) device, which comprises two or more than two emissive layers, of which at least one emissive layer is made of a quantum dot and at least one emissive layer is made of an organic light emission material.

Figure 1:
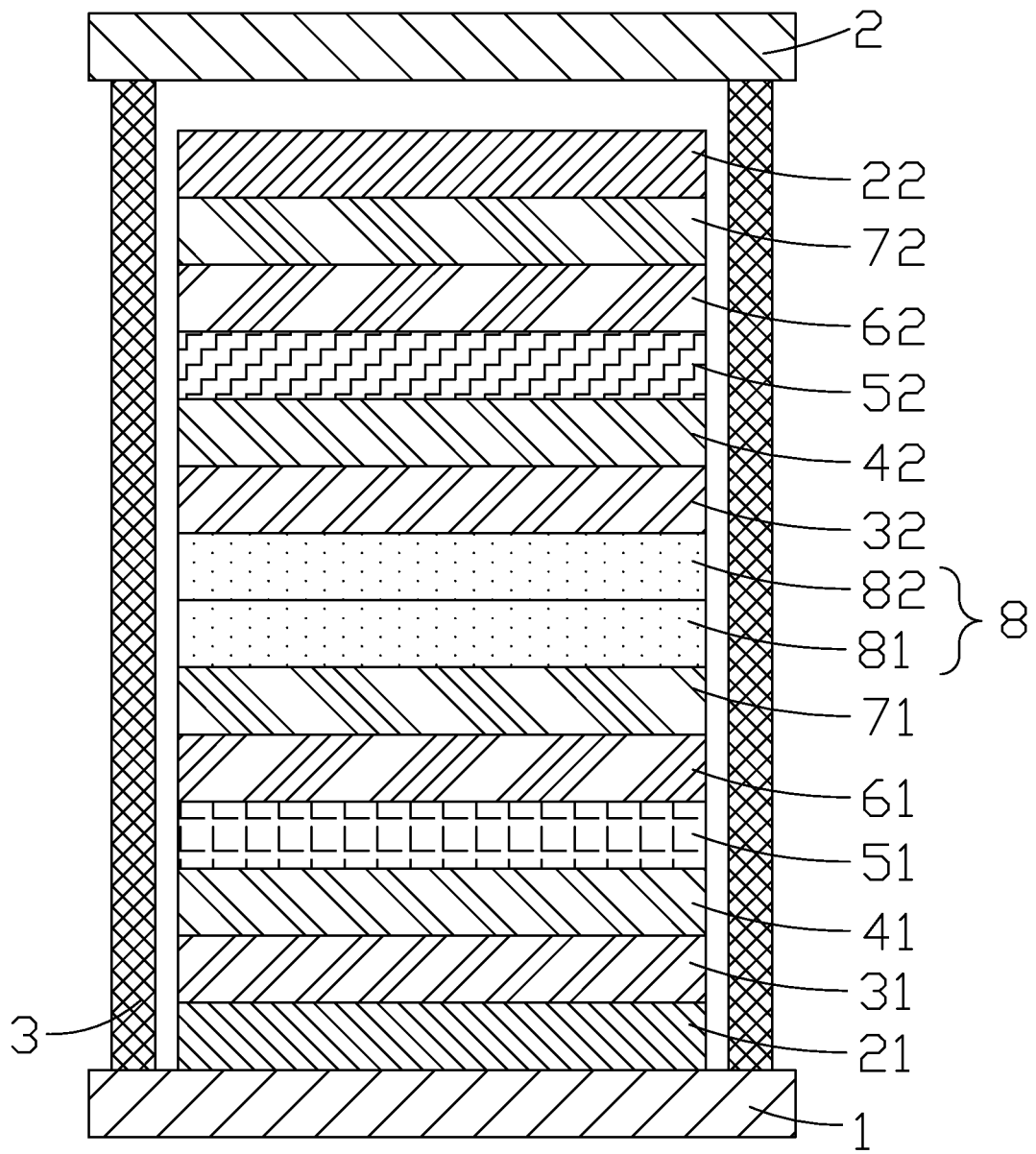
FIG. 1 is cross-sectional view showing a structure of a white OLED (Organic Light-Emitting Diode) device according to the present invention.

FIG. 1 illustrates a preferred embodiment of the structure of the white OLED device according to the present invention. In the embodiment, the number of emissive layers used is two, which are respectively a first emissive layer and a second emissive layer. Specifically, the structure of the white OLED device comprises a substrate 1, an anode 21 formed on the substrate 1, a first hole injection layer 31 formed on the anode 21, a first hole transporting layer 41 formed on the first hole injection layer 31, a first emissive layer 51 formed on the first hole transporting layer 41, a first electron transporting layer 61 formed on the first emissive layer 51, a first electron injection layer 71 formed on the first electron transporting layer 61, a charge generation layer 8 formed on the first electron injection layer 71, a second hole injection layer 32 formed on the charge generation layer 8, a second hole transporting layer 42 formed on the second hole injection layer 32, a second emissive layer 52 formed on the second hole transporting layer 42, a second electron transporting layer 62 formed on the second emissive layer 52, a second electron injection layer 72 formed on the second electron transporting layer 62, a cathode 22 formed on the second electron injection layer 72, a package cover plate 2 arranged above the cathode 22, and a sealing enclosure resin 3 arranged between the substrate 1 and the package cover plate 2 to bond the substrate 1 and the package cover plate 2 together.

In the structure of the white OLED device of the present invention, the substrate 1 and the package cover plate 2 are made of glass or flexible materials. At least one of the substrate 1 and the package cover plate 2 is light transmittable. Preferably, the substrate 1 and the package cover plate 2 are both glass sheets. The substrate 1 and the package cover plate 2 are bonded together by the sealing enclosure resin 3 to prevent invasion of external moisture and oxygen in order to achieve hermetic sealing for protection of internal electronic components.

The first emissive layer 51 is made of a quantum dot and the second emissive layer 52 is made of an organic light emission material. Since the quantum dot possess an extremely high fluorescence efficiency, the composite emissive layer composed of the first emissive layer 51 that is made of a quantum dot and the second emissive layer 52 that is made of an organic light emission material has a luminous efficiency that is greatly enhanced thereby increasing the brightness of a display device.

The quantum dot can be one or more of a blue quantum dot, a yellow quantum dot, a green quantum dot, a red quantum dot, and a white quantum dot. The light emitting from the organic light emission material of the second emissive layer 52 is combined with the light emitting from the quantum dot of the first emissive layer 51 to form white light.

The first electron transporting layer 61 and the second hole transporting layer 42 that are arranged between the first emissive layer 51 and the second emissive layer 52 respectively transport the electrons and holes that are generated in the charge generation layer 8 as being effected by an electric field to the first emissive layer 51 and the second emissive layer 52 to be respectively re-combined with holes and electrons injected from the anode 21 and the cathode 22 into the first emissive layer 51 and the second emissive layer 52 so as to generate light of different colors to be combined to form white light.

The charge generation layer 8 comprises a first charge generation layer 81 formed on the first electron injection layer 71 and a second charge generation layer 82 formed on the first charge generation layer 81. The first charge generation layer 81 shows the property of transporting electrons and the second charge generation layer 82 shows the property of transporting holes. Thus, the electrons generated by the charge generation layer 8 are transported through the first charge generation layer 81 to the first emissive layer 51, while the holes generated in the charge generation layer 8 are transported through the second charge generation layer 82 to the second emissive layer 52.

It is noted that the charge generation layer 8 can alternatively be a single-layered charge generation layer that is formed by mixing a p-type organic semiconductor and an n-type organic semiconductor. The interior and interfaces of the charge generation layer exhibits interactions between the p-type organic semiconductor and the n-type organic semiconductor so that the electrons generated in the charge generation layer are accumulated in the n-type organic semiconductor portion, while holes are accumulated in the p-type organic semiconductor portion, wherein under a predetermined voltage, the electrons and the holes are respectively conducted to the anode 21 and the cathode 22.

Figure 2:
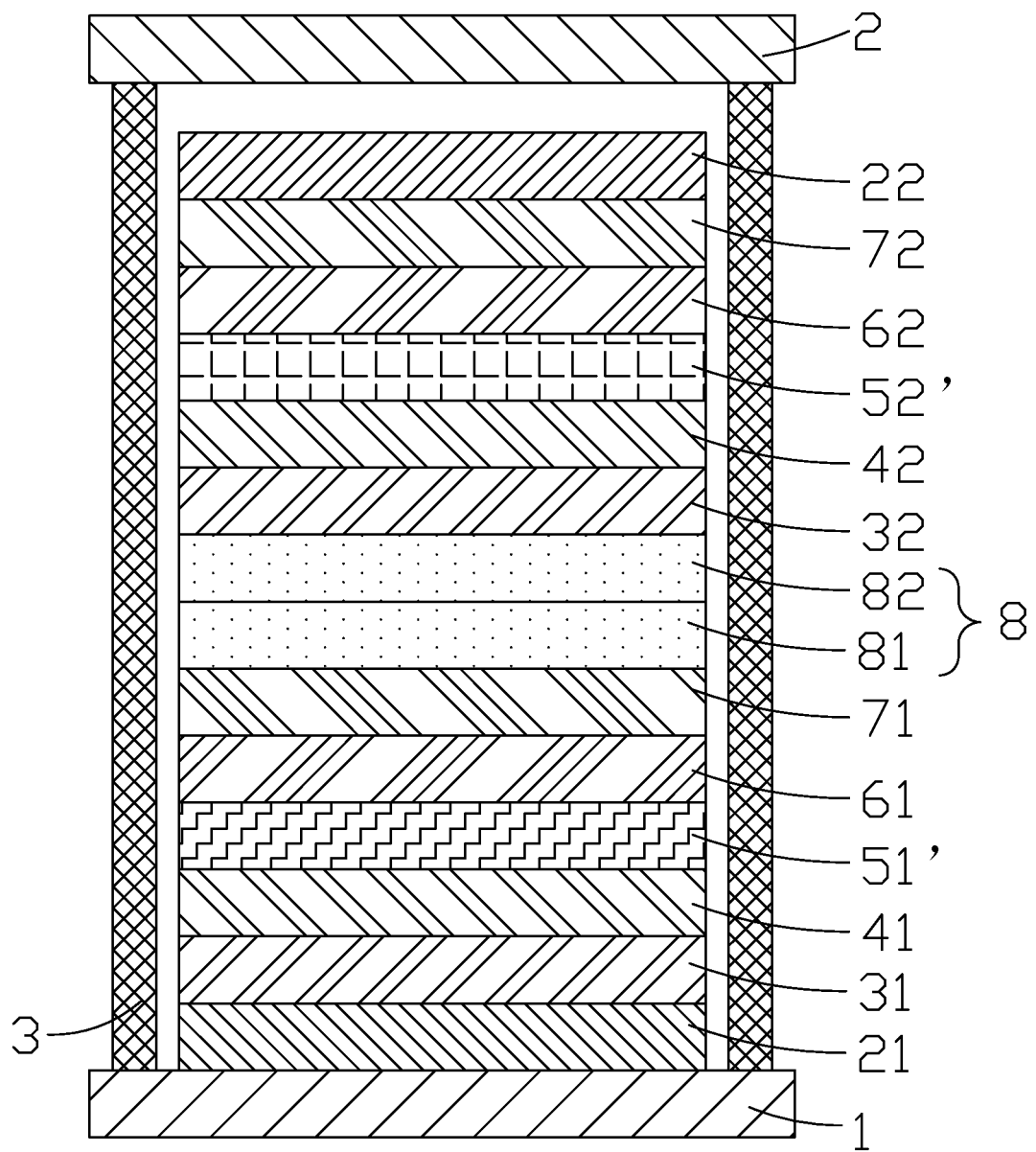
FIG. 2 is a cross-sectional view showing another structure of a white OLED device according to the present invention.

FIG. 2 shows another structure of a white OLED device according to the present invention, wherein a first emissive layer 51' is made of an organic light emission material and a second emissive layer 52' is made of a quantum dot.

The quantum dot can be one or more of a blue quantum dot, a yellow quantum dot, a green quantum dot, a red quantum dot, and a white quantum dot. The light emitting from the organic light emission material of the first emissive layer 51' is combined with the light emitting from the quantum dot of the second emissive layer 52' to form white light.

In summary, the present invention provides a structure of a white OLED device, which comprises a plurality of emissive layers, of which at least one of the emissive layers is made of a quantum dot and at least one of the emissive layers is made of an organic light emission material so as to combine the advantages of the quantum dot and the organic light emission material, wherein the manufacturing cost is low, the utilization of material is high, and the light emission efficiency is high thereby increasing the brightness of a display device and providing excellent performance for use in flat panel display devices, televisions, and other fields of display.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A structure of a white organic light-emitting (OLED) device, comprising two or more emissive layers, in which at least one of the emissive layers is made of a quantum dot and at least one of the emissive layers is made of an organic light emission material, wherein a charge generation layer is arranged between the emissive layer of quantum dot and the emissive layer of organic light emission material to generate first and second electric charges that are respectively fed into the quantum dot and the organic light emission material such that the quantum dot and the organic light emission material are respectively excited by the first and second electric charges to individually emit first light and second light according to the electric charges fed thereto, the first light and the second light being of complementary colors for formation of white light; and wherein the quantum dot, the organic light emission material, and the charge generation layer are collectively enclosed in a sealed package;

wherein the first electric charges are electrons and the second electric charges are holes, the white OLED device further comprising a substrate, an anode formed on the substrate, a first hole injection layer formed on the anode, a first hole transporting layer formed on the first hole injection layer, a first emissive layer formed on the first hole transporting layer, a first electron transporting layer formed on the first emissive layer, a first electron injection layer formed on the first electron transporting layer, the charge generation layer formed on the first electron injection layer, a second hole injection layer formed on the charge generation layer, a second hole transporting layer formed on the second hole injection layer, a second emissive layer formed on the second hole transporting layer, a second electron transporting layer formed on the second emissive layer, a second electron injection layer formed on the second electron transporting layer, a cathode formed on the second electron injection layer, a package cover plate arranged above the cathode, and a sealing enclosure resin arranged between the substrate and the package cover plate to bond the substrate and the package cover plate together, wherein the substrate, the package cover plate, and the sealing enclosure resin collectively form the sealed package.

2. The structure of the white OLED device as claimed in claim 1, wherein the first emissive layer is the emissive layer of quantum dot and the second emissive layer is the emissive layer of organic light emission material.

3. The structure of the white OLED device as claimed in claim 2, wherein the quantum dot comprises one or more of a blue quantum dot, a yellow quantum dot, a green quantum dot, a red quantum dot, and a white quantum dot that emits the first light and the second light emitting from the organic light emission material of the second emissive layer is combinable with the first light emitting from the quantum dot of the first emissive layer to form white light.

4. The structure of the white OLED device as claimed in claim 1, wherein the first electron transporting layer and the second hole transporting layer that are arranged between the first emissive layer and the second emissive layer respectively transport the electrons and the holes generated by the charge generation layer under an electric field to the first emissive layer and the second emissive layer to be respectively re-combined with holes and electrons injected from the anode and the cathode into the first emissive layer and the second emissive layer so as to generate the first light and the second light o be combined to form white light.

5. The structure of the white OLED device as claimed in claim 1, wherein the charge generation layer comprises a first charge generation layer formed on the first electron injection layer and a second charge generation layer formed on the first charge generation layer, the first charge generation layer showing property of transporting electrons, the second charge generation layer showing property of transporting holes.

6. The structure of the white OLED device as claimed in claim 1, wherein the charge generation layer is formed by mixing a p-type organic semiconductor and an n-type organic semiconductor.

7. The structure of the white OLED device as claimed in claim 1, wherein the first emissive layer is the emissive layer of organic light emission material and the second emissive layer is the emissive layer of quantum dot.

8. The structure of the white OLED device as claimed in claim 7, wherein the quantum dot comprises one or more of a blue quantum dot, a yellow quantum dot, a green quantum dot, a red quantum dot, and a white quantum dot that emits the first light and the second light emitting from the organic light emission material of the first emissive layer is combinable with the first light emitting from the quantum dot of the second emissive layer to form white light.

9. A structure of a white organic light-emitting (OLED) device, comprising two or more emissive layers, in which at least one of the emissive layers is made of a quantum dot and at least one of the emissive layers is made of an organic light emission material, wherein a charge generation layer is arranged between the emissive layer of quantum dot and the emissive layer of organic light emission material to generate first and second electric charges that are respectively fed into the quantum dot and the organic light emission material such that the quantum dot and the organic light emission material are respectively excited by the first and second electric charges to individually emit first light and second light according to the electric charges fed thereto, the first light and the second light being of complementary colors for formation of white light; and wherein the quantum dot, the organic light emission material, and the charge generation layer are collectively enclosed in a sealed package;

wherein the first electric charges are electrons and the second electric charges are holes, the white OLED device further comprising a substrate, an anode formed on the substrate, a first hole injection layer formed on the anode, a first hole transporting layer formed on the first hole injection layer, a first emissive layer formed on the first hole transporting layer, a first electron transporting layer 61 formed on the first emissive layer, a first electron injection layer formed on the first electron transporting layer, the charge generation layer formed on the first electron injection layer, a second hole injection layer formed on the charge generation layer, a second hole transporting layer formed on the second hole injection layer, a second emissive layer formed on the second hole transporting layer, a second electron transporting layer formed on the second emissive layer, a second electron injection layer formed on the second electron transporting layer, a cathode formed on the second electron injection layer, a package cover plate arranged above the cathode, and a sealing enclosure resin arranged between the substrate and the package cover plate to bond the substrate and the package cover plate together, wherein the substrate, the package cover plate, and the sealing enclosure resin collectively form the sealed package;

wherein the first emissive layer is the emissive layer of quantum dot and the second emissive layer is the emissive layer of organic light emission material;

wherein the quantum dot comprises one or more of a blue quantum dot, a yellow quantum dot, a green quantum dot, a red quantum dot, and a white quantum dot that emits the first light and the second light emitting from the organic light emission material of the second emissive layer is combinable with the first light emitting from the quantum dot of the first emissive layer to form white light;

wherein the first electron transporting layer and the second hole transporting layer that are arranged between the first emissive layer and the second emissive layer respectively transport the electrons and the holes generated by the charge generation layer under an electric field to the first emissive layer and the second emissive layer to be respectively re-combined with holes and electrons injected from the anode and the cathode into the first emissive layer and the second emissive layer so as to generate the first light and the second light to be combined to form white light;

wherein the charge generation layer comprises a first charge generation layer formed on the first electron injection layer and a second charge generation layer formed on the first charge generation layer, the first charge generation layer showing property of transporting electrons, the second charge generation layer showing property of transporting holes; and wherein the charge generation layer is formed by mixing a p-type organic semiconductor and an n-type organic semiconductor.

* * * * *